United States Patent
Chen et al.

(10) Patent No.: US 10,487,411 B1
(45) Date of Patent: Nov. 26, 2019

(54) METHOD FOR SYNCHRONOUS ELECTROPLATING FILLING OF DIFFERENTIAL VIAS AND ELECTROPLATING DEVICE IMPLEMENTING SAME

(71) Applicant: Guangdong University of Technology, Guangzhou, Guangdong (CN)

(72) Inventors: Yun Chen, Guangdong (CN); Xin Chen, Guangdong (CN); Dachuang Shi, Guangdong (CN); Xun Chen, Guangdong (CN); Qiang Liu, Guangdong (CN); Jian Gao, Guangdong (CN); Chengqiang Cui, Guangdong (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 16/383,852

(22) Filed: Apr. 15, 2019

(30) Foreign Application Priority Data

Apr. 16, 2018 (CN) .......................... 2018 1 0339287

(51) Int. Cl.
*C25D 21/04* (2006.01)
*C25D 5/02* (2006.01)
(Continued)

(52) U.S. Cl.
CPC ............... *C25D 5/024* (2013.01); *C25D 3/38* (2013.01); *C25D 5/022* (2013.01); *C25D 7/12* (2013.01);
(Continued)

(58) Field of Classification Search
CPC ...... C25D 21/04; C25D 5/003; C25D 17/001; C25D 5/024
(Continued)

(56) References Cited

U.S. PATENT DOCUMENTS 2,465,747 A * 3/1949 Pessel ..................... C25D 21/02
  204/278
5,840,675 A * 11/1998 Yeazell ..................... A47L 25/08
  510/417
(Continued)

FOREIGN PATENT DOCUMENTS

| CA | 1159790 A | 1/1984 |
| CN | 101501249 A | 8/2009 |

(Continued)

OTHER PUBLICATIONS

Yangyue, et al. Study on Properties of Laser-Enhanced Metal Electrodeposited Layer, Plating & Finishing, vol. 13, No. 1, 1991(1): 20-22.

*Primary Examiner* — Brian W Cohen
(74) *Attorney, Agent, or Firm* — Wayne & Ken, LLC; Tony Hom

(57) ABSTRACT

A method for synchronous electroplating filling of differential vias and an electroplating device. Laser irradiation is adopted as an external energy field to assist synchronous electroplating filling of differential vias. A mask or digital maskless technology is used to precisely heat the vias with different positions and different sizes. The filling rate of different regions varies with the temperature difference, thereby realizing the synchronous electroplating filling of differential vias in one step. In the processes of immersion pre-wetting by the electroplating liquid and electroplating filling copper, the laser is used for preheating the wafer processed with vias. In these two steps, the laser needs to locally and precisely heat upper surfaces of the micro vias on the wafer through the mask corresponding to the micro vias on the wafer.

1 Claim, 2 Drawing Sheets

(51) Int. Cl.
*C25D 7/12* (2006.01)
*C25D 3/38* (2006.01)
*H01L 21/288* (2006.01)
*H01L 21/768* (2006.01)
*C25D 17/00* (2006.01)
*H01L 23/532* (2006.01)

(52) U.S. Cl.
CPC ........... *C25D 17/001* (2013.01); *C25D 21/04* (2013.01); *H01L 21/288* (2013.01); *H01L 21/76898* (2013.01); *H01L 23/53228* (2013.01)

(58) Field of Classification Search
USPC ....................................................... 205/88, 91
See application file for complete search history.

(56) References Cited

U.S. PATENT DOCUMENTS

| | | | | |
|---|---|---|---|---|
| 6,554,585 | B1* | 4/2003 | Maracchi | F02B 71/04 |
| | | | | 123/46 R |
| 6,716,332 | B1* | 4/2004 | Yoshioka | C23C 18/1605 |
| | | | | 205/98 |
| 9,828,688 | B2* | 11/2017 | Buckalew | C25D 5/00 |
| 2010/0300887 | A1* | 12/2010 | Skeath | C25D 5/028 |
| | | | | 205/88 |
| 2014/0097088 | A1* | 4/2014 | Stowell | C25D 21/18 |
| | | | | 205/99 |

FOREIGN PATENT DOCUMENTS

| | | |
|---|---|---|
| CN | 102286760 A | 12/2011 |
| CN | 202090077 U | 12/2011 |
| CN | 103103585 A | 5/2013 |
| CN | 103361694 A | 10/2013 |
| CN | 204550745 U | 8/2015 |
| WO | WO-2013015491 A1 * | 1/2013 ......... C23C 18/1682 |

* cited by examiner

```
┌─────────────────────────────────────────────────────┐
│ Placing a wafer processed with vias into a chamber  │
│ filled with electroplating liquid; and vacuumizing  │
│ the chamber by a vacuum system to allow air bubbles │
│ in the electroplating liquid to escape.             │
└─────────────────────────────────────────────────────┘
```
```
┌─────────────────────────────────────────────────────┐
│ Aligning a mask with the wafer in the closed        │
│ chamber; and opening an integrated light source to  │
│ emit laser passing through light-transmitting areas │
│ on the mask and irradiating vias on the wafer.      │
└─────────────────────────────────────────────────────┘
```
```
┌─────────────────────────────────────────────────────┐
│ Connecting the wafer, immersed in the electroplating│
│ liquid, as a cathode to an anode of an electroplating│
│ power source; and turning on the electroplating     │
│ power source to perform a deposition reaction of    │
│ copper ions at the cathode.                         │
└─────────────────────────────────────────────────────┘
```
```
┌─────────────────────────────────────────────────────┐
│ Turning off the electroplating power source, the    │
│ integrated light source and the vacuum system after │
│ the electroplating is finished; and removing the    │
│ finished product by electroplating filling.         │
└─────────────────────────────────────────────────────┘
```

FIG. 1

METHOD FOR SYNCHRONOUS ELECTROPLATING FILLING OF DIFFERENTIAL VIAS AND ELECTROPLATING DEVICE IMPLEMENTING SAME

CROSS-REFERENCE TO RELATED APPLICATIONS

This application claims the benefit of priority from Chinese Patent Application No. CN201810339287.9, filed on Apr. 16, 2018. The content of the aforementioned application, including any intervening amendments thereto, is incorporated herein by reference in its entirety.

TECHNICAL FIELD

The present disclosure relates to electronics manufacturing, and more particularly to a method for synchronous electroplating filling of differential vias and an electroplating device implementing the same.

BACKGROUND OF THE INVENTION

Through-silicon via (TSV) is a 3D packaging technique that is developed to meet the needs of very large scale integration (VLSI) for integrated circuits. The TSV is expected to replace the traditional 2D interconnects. The TSV enables a chip stacking in three dimensions with higher density and smaller size by using 3D interconnect, such that the chip rate is significantly improved and the power consumption is reduced. Therefore, it is called the fourth generation packaging technology after wire bonding (WB), tape automated bonding (TAB) and flip chip (FC).

Generally, the process for creating a TSV structure of a wafer mainly includes the following steps.

(1) Preparation of though holes. Through-silicon vias with high width-to-depth ratio on the wafer are prepared by wet chemical etching (WCE), deep reactive-ion etching (DRIE) or laser drilling, etc.

(2) Electroplating of though holes. The metal of copper is electroplated through a pre-made metal seed layer to fill the entire through-silicon vias with the metal after a SiO2 insulating layer being prepared on sidewalls of the through-silicon vias.

(3) Chemical mechanical polishing (CMP). The wafer is thinned to expose the metal in the through-silicon vias by the polishing liquid and mechanical force.

In step (2), electroplating copper in the through holes is critically important to TSV technique so as to achieve electrical signal interconnect, which accounts for 40% of TSV cost.

At present, in step (2), a bottom-up electroplating is generally used for electroplating the copper in the through holes. The specific process is as follows. The wafer processed with a TSV structure and sputtered with a seed layer is immersed in an electroplating liquid including an accelerator, an inhibitor and a leveling agent, etc. The metal is deposited after the electroplating liquid enters the though holes to come into contact with the exposed seed layer. The copper is deposited along the though holes from bottom to top, gradually filling the through holes completely during the electroplating.

However, through-silicon vias of different sizes are generally processed on the same wafer according to the function requirements. During the electroplating process, the electroplating liquid are easy to enter the large vias due to its large size, so that the filling is fast; while the electroplating liquid is difficult to enter some through-silicon vias with extremely small size (with a diameter of 2-50 μm), resulting in slow electroplating filling. In addition, voids and gaps will also be formed, which seriously affect the reliability of the chip.

Similarly, for the printed circuit board, the above problems will also occur in the electroplating of the micro vias of different sizes that are provided on the same circuit board.

At present, there is still no method to achieve synchronous filling of vias with different sizes whether it is TSVs or the vias on the printed circuit board. Therefore, it is necessary to propose a method and a device to overcome the above defects, and realize the synchronous electroplating filling of the differential vias in one step.

SUMMARY OF THE INVENTION

In order to overcome the defects of the prior art, the present application provides a method and a device for synchronous electroplating filling of differential vias by heating different regions through laser allowing for different filling rates in different regions.

A method for synchronous electroplating filling of differential vias, including:

step a: placing a wafer processed with vias into a chamber filled with an electroplating liquid; vacuumizing the chamber by a vacuum system to allow air bubbles in the electroplating liquid to escape; aligning a mask with the wafer in the chamber which is closed and opening an integrated light source to emit laser; wherein the laser passes through a light-transmitting area on the mask and irradiates the vias on the wafer;

step b: connecting the wafer fully immersed in step a to an anode of an electroplating power source; wherein the wafer serves as a cathode for electroplating;

step c: turning on the electroplating power source to perform a deposition reaction of copper ions at the cathode;

step d: turning off the electroplating power source, the integrated light source and the vacuum system after the electroplating is finished; removing the finished product by electroplating filling.

In some embodiments, the vias of the wafer is 2-50 μm in diameter.

In some embodiments, the electroplating liquid includes an accelerator, an inhibitor and/or a leveling agent.

The accelerator can accelerate the electroplating filling rate and improve the electroplating filling efficiency. The inhibitor can inhibit the generation of other unnecessary ions. The leveling agent can improve the flatness of inner walls of the vias after electroplating filling, achieving a higher quality of the vias on the wafer.

In some embodiments, a wavelength of the laser is 400 nm-1 mm; and a laser power is 10 mW-10 W.

After performing several experiments and combining with vacuum degree, temperature and electroplating parameters, it is found that the above method can achieve better electroplating filling effect on the vias with different diameters on the wafer only under the condition that the wavelength of the laser is 400 nm-1 mm, and the laser power is 10 mW-10 W.

In some embodiments, the wafer placed in the chamber is less than 12 inches in size; and the chamber is vacuumized by a vacuum pump to a vacuum degree of less than or equal to 10E-5 Pa. After performing several experiments in combination with the vacuum degree, temperature and electroplating parameters, it is found that the present method achieves better electroplating filling effect on the vias with different diameters on the wafer of less than 12 inches in size only under the condition that the vacuum degree is less than or equal to 10E-5 Pa.

An electroplating device for implementing the method described above, including: a chamber, a wafer holder, a cover, a vacuum system, and a locking mechanism. An upper end of the chamber is provided with an opening. The cover is provided with a glass plate, a mask, an integrated light source and an optical fiber. The glass plate is arranged on a plane in which the cover covers the opening. The mask is processed with a light-transmitting area corresponding to the vias on the wafer. The integrated light source is arranged above the mask and the glass plate. The wafer holder is arranged in a cavity inside the chamber. The opening is covered by the cover which is locked by the locking mechanism. The vacuum system is configured to vacuumize the chamber.

In some embodiments, the cover is provided with an adhering mechanism. The mask is fastened to the glass plate through adhesion by the adhering mechanism, providing a better attachment of the mask and the glass plate, such that no interference occurs under laser radiation.

In some embodiments, the integrated light source emits laser having a wavelength of 400 nm-1 mm and a power of 10 mW-10 W.

In some embodiments, a bottom of the wafer holder is provided with a waste liquid discharge orifice connected to a waste liquid discharge pipe. A power supply circuit is arranged in the chamber and communicates with the environment through a power cable for electroplating.

In some embodiments, the electroplating device further includes a control system. The control system is electrically connected to the integrated light source, the power supply circuit, the vacuum system, a temperature control system and a time controller which are arranged in the chamber. The control system can respectively control the power and irradiation time of the laser source; the vacuum degree, temperature and holding time of the chamber; and the voltage (constant potential mode), current (constant current mode) and electroplating time, etc. of the electroplating power source, such that the operation of the electroplating device can be fully automated.

The invention provides a method for synchronous electroplating filling of differential vias. Laser irradiation is adopted as an external energy field to assist synchronous electroplating filling of differential vias. The mask or digital maskless technology is used to heat the vias of different sizes at different regions in a precise manner. The filling rate at different regions varies with temperatures, thereby realizing the synchronous electroplating filling of the differential vias in one step. In the processes of immersion pre-wetting by the electroplating liquid and copper electroplating filling, the laser is used for preheating the wafer processed with vias. In these two steps, the laser locally and precisely heat upper surfaces of the micro vias on the wafer through the mask corresponding to the micro vias on the wafer. After the electroplating liquid on the surfaces of part of the micro vias on the wafer and nearby are heated, the viscosity and surface tension of the electroplating liquid are reduced, and the electroplating liquid easily enters the micro vias with higher width-to-depth ratio, taccelerating the electroplating rate and reducing the voids.

BRIEF DESCRIPTION OF THE DRAWINGS

FIG. 1 is a flow chart showing a method for synchronous electroplating filling of differential vias according to an embodiment of the present invention.

Figure 2:
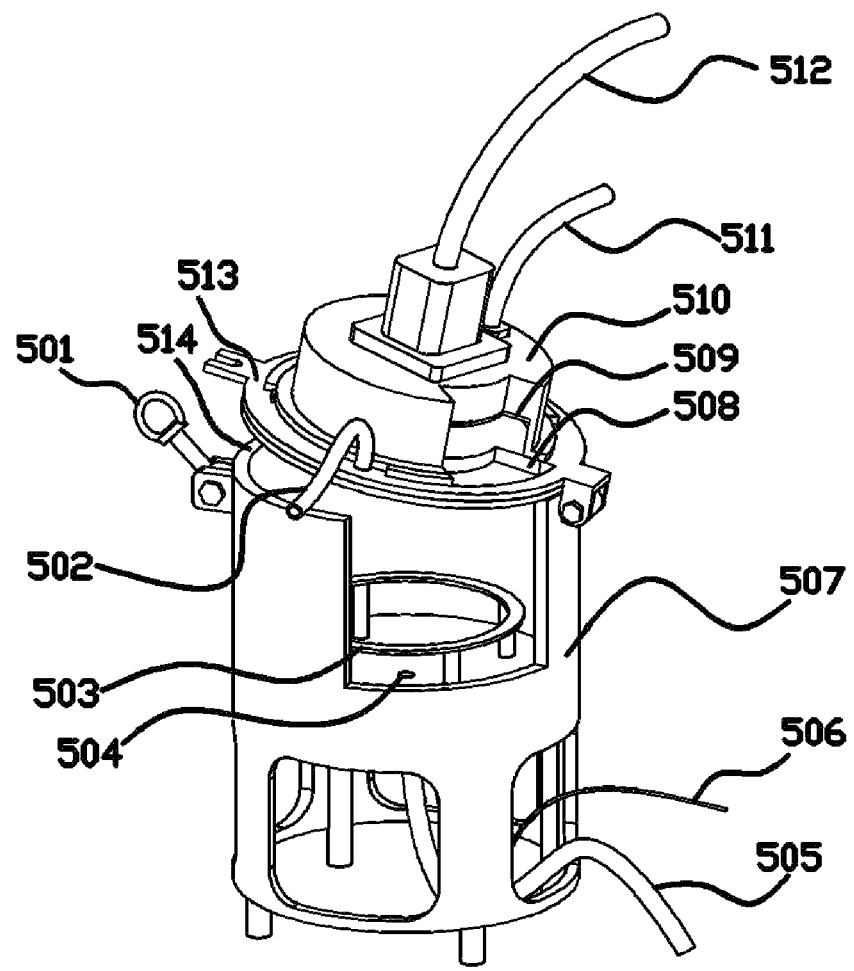
FIG. 2 is a partial schematic diagram of an electroplating device according to an embodiment of the present invention.

Reference numerals: 501, locking mechanism; 502, vacuum system; 503, wafer holder; 504, waste liquid discharge orifice; 505, waste liquid discharge pipe; 506, electroplating power source; 507, chamber; 508, glass plate; 509, mask; 510, integrated light source; 511, adhering mechanism; 512, optical fiber; 513, cover; and 514, opening.

DETAILED DESCRIPTION OF EMBODIMENTS

The technical solution of the present invention will be further described below with reference to the accompanying drawings and embodiments.

Example 1

In this embodiment, a method for synchronous electroplating filling of differential vias is as follows.

Step a: A wafer processed with TSVs is placed on a wafer holder 503 in a chamber 507 filled with an electroplating liquid. The chamber 507 is vacuumized by a vacuum system 502 to allow air bubbles in the electroplating liquid to escape and facilitate the electroplating liquid to enter the TSVs. A mask 509 is placed in an integrated light source 510. The mask 509 is aligned with the wafer on the wafer holder 503 in the chamber 507. The laser is transmitted into the integrated light source 510 through an optical fiber 512. The laser passes through a light-transmitting area on the mask 509 and precisely irradiates the TSVs on the wafer. The temperature rise of the TSVs area is precisely controlled to promote the electroplating liquid to flow and enter the TSVs with smaller sizes and relatively greater width-to-depth ratio, and achieve good wetting with the via walls.

Step b: The wafer fully immersed in step a is connected to an anode of an electroplating power source 506 where the wafer serves as a cathode for electroplating.

Step c: The electroplating power source 506 is turned on to perform a deposition reaction of copper ions at the cathode.

Step d: The electroplating power source 506, the integrated light source 510 and the vacuum system 502 are turned off after the electroplating is finished. The finished product by electroplating filling is removed.

Specifically, in step a, the TSVs of the wafer is 2-50 μm in diameter.

Specifically, in step a, the electroplating liquid includes an accelerator, an inhibitor and a leveling agent.

Specifically, in step a, the glass plate 508 is transparent and allows the laser to pass through and irradiate the chamber 507.

Specifically, in step a, the mask 509 is processed with a light-transmitting area corresponding to the TSVs on the wafer.

Specifically, in step a, a wavelength of the laser is 400 nm-1 mm; and a laser power is 10 mW-10 W.

Specifically, in step a, the wafer placed in the chamber is less than 12 inches in size; and the chamber 507 is vacuumized by the vacuum system 502 to a vacuum degree of less than or equal to 10E-5 Pa.

Specifically, the control system is used in steps a, b and c to respectively control the power and irradiation time of the laser source, and the vacuum degree, the temperature and holding time of the chamber 507, and the voltage (constant potential mode), current (constant current mode) and electroplating time, etc. of the electroplating power source 506.

An electroplating device for implementing the method described above includes: a locking mechanism 501, a vacuum system 502, a wafer holder 503, a waste liquid discharge orifice 504, a waste liquid discharge pipe 505, an electroplating power source 506, a chamber 507, a glass plate 508, a mask 509, an integrated light source 510, an adhering mechanism 511, an optical fiber 512, a cover 513, and a control system. An upper end of the chamber 507 is provided with an opening 514.

Specifically, the glass plate 508 is transparent and allows the laser to pass through and irradiate into the chamber 507.

Specifically, the integrated light source may emit laser with a wavelength of 400 nm-1 mm and a power of 10 mW-10 W.

Specifically, the mask 509 is processed with a light-transmitting area corresponding to the TSVs on the wafer.

Preferably, a digital maskless technology can replace the mask to perform laser heating on vias with different sizes simultaneously.

Specifically, the chamber can accommodate the wafer with a size less than 12 inches. The chamber is vacuumized by a vacuum pump to a vacuum degree of less than or equal to 10E-5 Pa.

Specifically, the electroplating power source includes an electroplating cathode and an electroplating anode.

Specifically, the control system can respectively control the power and the irradiation time of the laser source, the vacuum degree, the temperature, a pressure holding time and a temperature holding time of the chamber, and the voltage (constant potential mode), the current (constant current mode) and the electroplating time, etc. of the electroplating power source.

In the processes of immersion pre-wetting by the electroplating liquid and electroplating filling copper, the laser is used for preheating the wafer processed with vias. In these two steps, the laser needs to locally and precisely heat upper surfaces of the micro vias on the wafer through the mask corresponding to the micro vias on the wafer. After the electroplating liquid on the surfaces of part of the micro vias on the wafer and nearby are heated, the viscosity and surface tension of the electroplating liquid reduces, and the electroplating liquid is easier to enter the micro vias with higher width-to-depth ratio, thereby accelerating the electroplating speed and reducing the voids.

Differences between various embodiments are described in the above embodiments of the present application. Various optimal features of the embodiments may be combined to form a further embodiment.

The embodiments are only illustrative of the present application, and are not intended to limit the application. It should be understood that for those of ordinary skills in the art, improvements or variations can be made based on the above descriptions, and such improvements and variations fall within the scope of the appended claims.

What is claimed is:

1. A method for synchronous electroplating filling of differential vias, comprising:
   step a: placing a wafer processed with vias into a chamber filled with an electroplating liquid; vacuumizing the chamber by a vacuum system to allow air bubbles in the electroplating liquid to escape; aligning a mask with the wafer in the chamber which is closed and opening an integrated light source to emit laser; wherein the laser passes through a light-transmitting area on the mask and irradiates the vias on the wafer;
   step b: connecting the wafer fully immersed in step a to an anode of an electroplating power source; wherein the wafer serves as a cathode for electroplating;
   step c: turning on the electroplating power source to perform a deposition reaction of copper ions at the cathode;
   step d: turning off the electroplating power source, the integrated light source and the vacuum system after the electroplating is finished; removing the finished product by electroplating filling;
   wherein, in step a, the vias of the wafer is 2-50 μm in diameter; the electroplating liquid comprises an accelerator, an inhibitor and/or a leveling agent;
   a wavelength of the laser is 400 nm-1 mm; and a laser power is 10 mW-10 W; the wafer placed in the chamber is less than 12 inches in size; and the chamber is vacuumized by a vacuum pump to a vacuum degree of less than or equal to 10E-5 Pa.

* * * * *